(12) United States Patent
Akazawa et al.

(10) Patent No.: US 11,511,389 B2
(45) Date of Patent: Nov. 29, 2022

(54) POLISHING HEAD AND POLISHING APPARATUS

(71) Applicant: EBARA CORPORATION, Tokyo (JP)

(72) Inventors: Kenichi Akazawa, Tokyo (JP); Makoto Kashiwagi, Tokyo (JP); Yu Ishii, Tokyo (JP); Atsushi Yoshida, Tokyo (JP); Kenichi Kobayashi, Tokyo (JP); Tetsuji Togawa, Tokyo (JP); Hozumi Yasuda, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 446 days.

(21) Appl. No.: 16/575,844

(22) Filed: Sep. 19, 2019

(65) Prior Publication Data

US 2020/0094371 A1 Mar. 26, 2020

(30) Foreign Application Priority Data

Sep. 20, 2018 (JP) .............................. JP2018-176354

(51) Int. Cl.
*B24B 37/10* (2012.01)
*B24B 41/06* (2012.01)
(Continued)

(52) U.S. Cl.
CPC ............ *B24B 37/105* (2013.01); *B24B 41/06* (2013.01); *B24B 49/16* (2013.01); *B24B 7/228* (2013.01);
(Continued)

(58) Field of Classification Search
CPC ......... B24B 7/228; B24B 37/04; B24B 37/10; B24B 37/105; B24B 37/30; B24B 37/32; B24B 37/27; B24B 49/08; B24B 49/16
(Continued)

(56) References Cited

U.S. PATENT DOCUMENTS

| 4,918,869 A | * | 4/1990 | Kitta | ..................... B24B 37/102 |
| | | | | 451/288 |
| 8,591,286 B2 | * | 11/2013 | Chen | ..................... B24B 37/015 |
| | | | | 451/286 |

(Continued)

FOREIGN PATENT DOCUMENTS

| CN | 106425833 A | 2/2017 |
| JP | 2000-094301 A | 4/2000 |

(Continued)

*Primary Examiner* — Joel D Crandall
*Assistant Examiner* — Robert F Neibaur
(74) *Attorney, Agent, or Firm* — BakerHostetler (57) ABSTRACT

Disclosed is a polishing head for a polishing apparatus for polishing a quadrangular substrate using a polishing pad attached to a polishing table, comprising a head body portion, a plurality of elastic bags disposed in a surface of the head body portion, which is to face the polishing table, and a substrate holding plate for holding the substrate, the substrate holding plate being pressed by the elastic bags in a direction away from the head body portion, the head body portion being provided with channels for bags, which are in communication with the respective elastic bags, the polishing head further including at least two support plates disposed between the elastic bags on one hand and the substrate holding plate on the other, the elastic bags being configured to press the substrate holding plate through the support plates.

11 Claims, 6 Drawing Sheets

(51) Int. Cl.
    *B24B 49/16*    (2006.01)
    *B24B 7/22*     (2006.01)
    *B24B 41/00*    (2006.01)
    *B24B 37/005*   (2012.01)
    *B24B 37/30*    (2012.01)

(52) U.S. Cl.
    CPC ............ *B24B 37/005* (2013.01); *B24B 37/30* (2013.01); *B24B 41/005* (2013.01)

(58) Field of Classification Search
    USPC .................................. 451/41, 288, 388, 398
    See application file for complete search history.

(56) References Cited

U.S. PATENT DOCUMENTS

| | | | |
|---|---|---|---|
| 9,199,354 B2* | 12/2015 | Duescher | B24B 37/30 |
| 2005/0208880 A1* | 9/2005 | Saito | B24B 49/14 |
| | | | 451/11 |
| 2015/0273657 A1 | 10/2015 | Fukushima et al. | |
| 2016/0016280 A1* | 1/2016 | Chen | B24B 37/10 |
| | | | 438/692 |
| 2016/0193712 A1 | 7/2016 | Komura | |
| 2017/0036318 A1* | 2/2017 | Yamamoto | H01L 21/30625 |

FOREIGN PATENT DOCUMENTS

| | | |
|---|---|---|
| JP | 2002-252192 A | 9/2002 |
| JP | 2015-039742 A | 3/2015 |
| JP | 2017-164901 A | 9/2017 |

\* cited by examiner

POLISHING HEAD AND POLISHING APPARATUS

CROSS-REFERENCE TO RELATED APPLICATION

This application is based upon and claims the benefit of priority of the prior Japanese Patent Application No. 2018-176354, filed on Sep. 20, 2018, the entire content of which is incorporated herein by reference.

TECHNICAL FIELD

The invention relates to a polishing head and a polishing apparatus.

BACKGROUND ART

There are conventionally-known polishing apparatuses which are designed to press a substrate against a polishing pad and thus polish the substrate. Substrate polishing apparatuses with polishing pads sometimes use a membrane member (hereinafter, referred to simply as "membrane") formed of an elastic body, to regulate a local pressing force generated between the substrate and the polishing pad. For instance, the Japanese Unexamined Patent Application Publication (Kokai) No. 2017-164901 (Patent Literature 1) discusses a substrate polishing apparatus with a membrane placed under a head body, the membrane being sectioned by peripheral walls into a plurality of pressure chambers. According to the Patent Literature 1, the pressing force applied to the substrate can be regulated on an area-by-area basis if the internal pressures of the pressure chambers are individually regulated.

CITATION LIST

Patent Literature

PTL 1: Japanese Unexamined Patent Application Publication (Kokai) No. 2017-164901

SUMMARY OF INVENTION

Technical Problem

It is known that, when a substrate to be polished is quadrangular, the corners of the substrate and the middle portions of edges of the substrate are prone to be polished with a larger polishing amount than other portions of the substrate, depending on how the substrate polishing apparatus is configured. When a quadrangular substrate is polished, therefore, it is preferable that the pressing forces applied near the corners of the substrate and the middle portions of edges of the substrate can be locally regulated. Nevertheless, if the polishing is carried out using a membrane which is sectioned into a circular or ring-like shape as with the membrane disclosed in the Patent Literature 1, it is difficult to locally regulate the pressing forces applied near the corners and the middle portions of edges of the quadrangular substrate.

To solve the foregoing problem, the present patent application is directed to provide a configuration which is preferable for polishing a quadrangular substrate.

Solution to Problem

The present patent application discloses, as one embodiment, a polishing head of a polishing apparatus for polishing a quadrangular substrate using a polishing pad attached to a polishing table, the polishing head comprising a head body portion, a plurality of elastic bags disposed in a surface of the head body portion, which is to face the polishing table, a substrate holding plate for holding a substrate, the substrate holding plate being pressed by the elastic bags in a direction away from the head body portion, the head body portion being provided with channels for bags, which are in communication with the respective elastic bags, the polishing head further comprising at least two support plates disposed between the elastic bags on one hand and the substrate holding plate on the other, the elastic bags being configured to press the substrate holding plate through the support plates.

DESCRIPTION OF EMBODIMENTS

Figure 1:
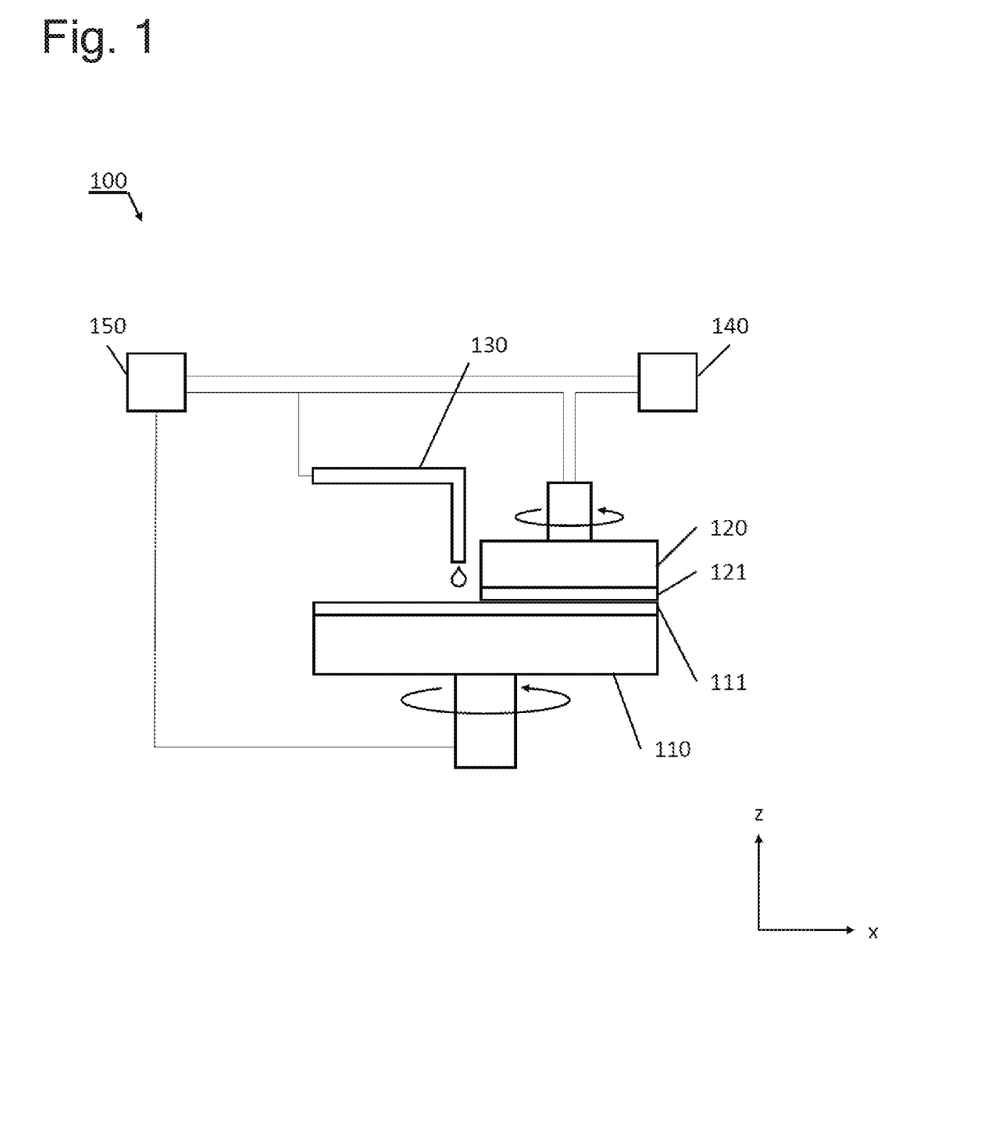
FIG. 1 is an elevation view of a polishing apparatus.

The following description explains one embodiment of the invention with reference to the attached drawings. The drawings for explaining the embodiment are diagrams. The components illustrated in the drawings therefore can differ from those of an actual apparatus in size, position, shape, etc. FIG. 1 is an elevation view of a substrate polishing apparatus 100 according to one embodiment. The substrate polishing apparatus 100 is an apparatus for polishing a quadrangular substrate using a polishing pad 111 attached to a polishing table 110. Referring to FIG. 1, a horizontal direction is an X direction (a right-hand direction in the figure is a positive X direction); a direction perpendicular to the figure plane is a Y direction (a direction from the figure plane is a positive Y direction); and a vertical direction is a Z direction (an upward direction in the figure is a positive Z direction). The substrate polishing apparatus 100 of FIG. 1 is a CMP (Chemical Mechanical Polishing) apparatus of a so-called rotary and facedown type (namely, an apparatus of a type which performs the polishing with a to-be-polished surface of a substrate facing downward). As discussed later, the substrate polishing apparatus 100 may be a CMP apparatus of a face-up type. The substrate polishing apparatus 100 of FIG. 1 includes the polishing table 110, a polishing head 120, and a liquid discharging mechanism 130. Connected to the substrate polishing apparatus 100 is a pressure regulating mechanism 140. The substrate polishing apparatus 100 further includes a controller 150 for controlling each element.

The polishing table 110 is configured as rotatable around the Z direction within an X-Y plane. More specifically, the polishing table 110 is rotatable at least in one direction by a motor or the like, not shown. The polishing pad 111 is detachably attached to an upper surface of the polishing table 110. The polishing table 110 of FIG. 1 is rotatable anticlockwise as viewed from above.

The polishing head 120 is disposed above the polishing table 110 to face the polishing table 110. Detachably attached to a lower surface of the polishing head 120 is a quadrangular substrate 121. The polishing head 120 is rotatable at least in one direction by a motor or the like, not shown. The polishing head 120 of FIG. 1 is rotatable anticlockwise (the same direction as the rotational direction of the polishing table 110) as viewed from above. The polishing head 120 is vertically movable by a mechanism, not shown, for moving the head in a vertical direction. The substrate 121 is pressed against the polishing pad 111 on the polishing table 110, and at least either one of or preferably both of the polishing table 110 and the polishing head 120 are rotated. The substrate 121 is polished in the foregoing manner. The rotational direction of the polishing table 110 and the polishing head 120 is merely an example.

The liquid discharging mechanism 130 is intended to discharge liquid, such as a polishing solution, a chemical solution and/or a cleaning solution, toward the polishing pad 111. Preferably, the polishing solution is discharged from the liquid discharging mechanism 130 while the substrate 121 is being polished. Preferably, the cleaning solution is discharged from the liquid discharging mechanism 130 while the polishing pad 111 and/or the substrate 121 is being cleaned. The liquid discharging mechanism 130 may be designed as appropriate in terms of specific configuration, for example, number, shape and position of the liquid discharging mechanism 130, kind and amount of the liquid to be discharged, and when to discharge the liquid.

Figure 2A:
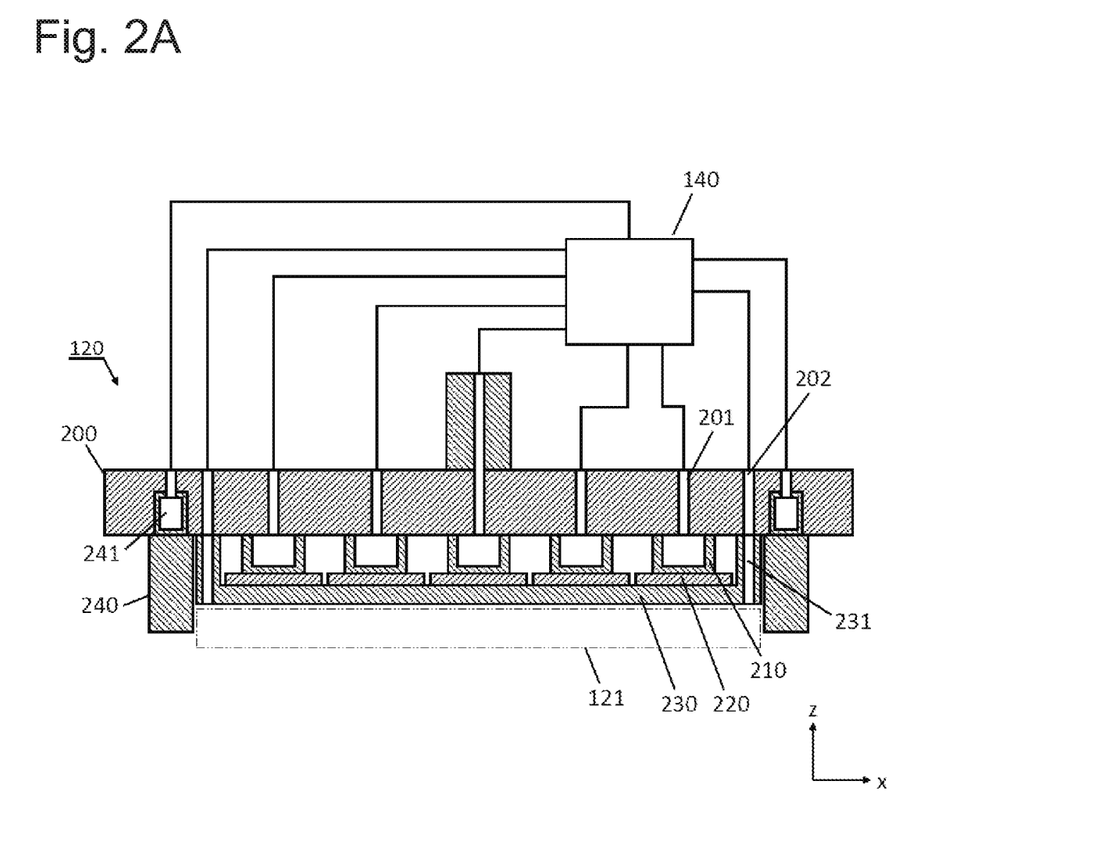
FIG. 2A is an elevation sectional view of a polishing head.
Figure 2B:
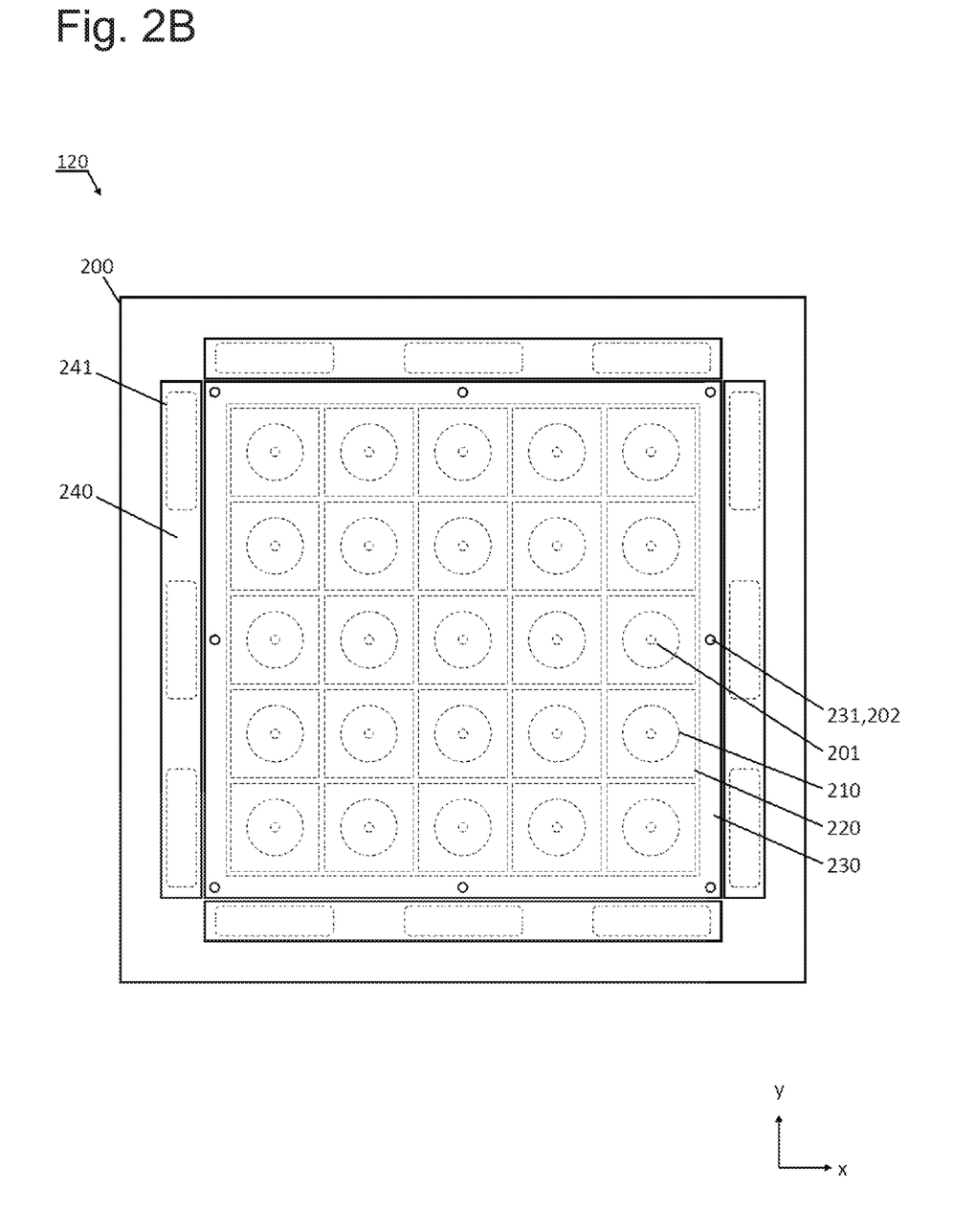
FIG. 2B is a bottom view of the polishing head.

A pressure regulating mechanism 140 is a mechanism for feeding fluid into each of elastic bags 210 (see FIG. 2) discussed later and/or removing the fluid from each of the elastic bags 210. The pressure regulating mechanism 140 is capable of regulating internal pressures of the elastic bags 210 individually by feeding or removing the fluid. The pressure regulating mechanism 140 may be an element constructing a part of the substrate polishing apparatus 100. In addition or alternatively, it is possible to use the pressure regulating mechanism 140 independent from the substrate polishing apparatus 100. According to an example illustrated in FIG. 1, the pressure regulating mechanism 140 functions also as a pressure reducing mechanism which is used to vacuum-suck the substrate 121. Instead of the pressure regulating mechanism 140, a vacuum generator which is separately provided may be used to vacuum-suck the substrate 121. A typical fluid which is fed from the pressure regulating mechanism 140 is air. The pressure regulating mechanism 140, however, may be configured to feed other fluids than air, which include pure water, nitrogen gas, and other like fluids. The pressure regulating mechanism 140 may be provided with a fluid-flow regulating mechanism, for example, a valve, a regulator or the like. In addition or alternatively, a valve, a regulator or the like may be provided to a channel (for example, channels 201 for bags (see FIG. 2)) which is formed inside the polishing head 120.

A configuration of the polishing head 120 will be now discussed in details with reference to FIG. 2. FIG. 2A is an elevation sectional view of the polishing head 120. FIG. 2A further shows the substrate 121 with imaginary lines. FIG. 2A still further shows the pressure regulating mechanism 140. FIG. 2B is a bottom view of the polishing head 120.

The polishing head 120 includes a head body portion 200, the elastic bags 210, support plates 220, and a substrate holding plate 230. Preferably, the polishing head 120 is provided with a retainer 240. Although FIG. 2 show the head body portion 200 having a shape of a quadrangular pillar, the shape of the head body portion 200 is not limited to the quadrangular pillar-like shape.

An example illustrated in FIG. 2 includes the elastic bags 210 in five rows and five columns (twenty-five elastic bags 210) (in FIG. 2, only one of the elastic bags 210 is provided with the reference mark as a representative). Preferably, the elastic bags 210 are disposed in the polishing head 120 to be located above a position in which the substrate 121 is supported. Preferably, the elastic bags 210 are arranged in rows and columns or tightly packed according to the shape of the substrate 121. The arrangement of the elastic bags 210 according to the shape of the substrate 121 facilitates control over a local pressing force generated between the substrate 121 and the polishing pad 111.

FIG. 2 show the elastic bags 210 each having a columnar shape. The elastic bags 210, however, may have another shape instead of the columnar shape. For example, quadrangular pillar-like elastic bags 210 may be used. Each of the elastic bags 210 is a sac-like member made of an elastic body that is expandable/contractible at least in the Z direction. The elastic bags 210 are disposed in a surface (lower surface in FIG. 2) of the head body portion 200, which is to face the polishing table 110.

For the purpose of feeding the fluid into internal spaces of the elastic bags 210, the head body portion 20 is provided with channels 201 for bags (in FIG. 2, only one of the channels 201 for bags is provided with the reference mark as a representative). More specifically, the channels 201 for bags are provided for the respective elastic bags 210. The channels 201 for bags are connected to the pressure regulating mechanism 140. That is, the elastic bags 210 are connected to the pressure regulating mechanism 140 through the respective channels 201 for bags. A plurality of elastic bags 210 may be connected to a single channel 201 for a bag, and a single channel 201 for a bag may be provided for a plurality of pressure regulating mechanisms 140.

The internal spaces of the elastic bags 210 are isolated from external spaces of the elastic bags 210. The internal spaces of the elastic bags 210 are tightly-sealed spaces. When the fluid is fed into the elastic bags 210 by the pressure regulating mechanism 140, the internal spaces of the elastic bags 210 are pressurized. When the internal spaces of the elastic bags 210 are pressurized, the elastic bags 210 are expanded at least in a direction away from the head body portion 200 (Z-axis negative direction in the present example, that is, a downward direction on FIG. 2A). The expanded elastic bags 210 press the substrate holding plate 230 discussed later in a direction away from the head body portion 200 through the support plates 220 discussed later. In other words, pressure generated by the expansion of the elastic bags 210 is transmitted to the substrate holding plate 230 through the support plates 220. The substrate holding plate 230 pushed by the support plates 220 pushes the substrate 121 in the Z-axis negative direction.

When the pressure regulating mechanism 140 reduces the pressures in the internal spaces of the elastic bags 210, a force with which the elastic bags 210 push the substrate 121 is decreased. The pressing force generated between the substrate 121 and the polishing pad 111 can be locally controlled by regulating the internal pressures of the elastic bags 210 individually.

The elastic bags 210 are elastic bodies and therefore have indefinite shape. If the elastic bags 210 are configured to directly push the substrate holding plate 230 discussed later, surfaces of the elastic bags 210, which push the substrate holding plate 230, can be unstable in shape as the elastic bags 210 are affected by the respective adjacent elastic bags 210. If the elastic bags 210 are configured to directly push the substrate holding plate 230, there is a possibility that an X-Y direction force acting on the substrate holding plate 230 during the polishing displaces the surfaces of the elastic bags 210, which push the substrate holding plate 230. To solve this, the support plates 220 are disposed between the elastic bags 210 on one hand and the substrate holding plate 230 on the other (in FIG. 2, only one of the support plates 220 is provided with the reference mark as a representative). According to the example illustrated in FIG. 2, the support plates 220 are disposed between the respective elastic bags 210 and the substrate holding plate 230. It can be also said that the support plates 220 of FIG. 2 are arranged to correspond to the respective elastic bags 210. Each of the support plates 220 of FIG. 2 is formed in a shape of a quadrangular pillar having a square bottom surface. The support plates 220, however, may be formed in another shape instead of the shape illustrated in FIG. 2.

The support plates 220 are preferably higher in rigidity than the elastic bags 210. For example, the support plates 220 may be made of stainless steel. If the support plates 220 have higher rigidity than the elastic bags 210, the surfaces of the elastic bags 210 push the substrate holding plate 230 while following the shape of the support plate 230. The elastic bags 210 thus can keep the shape of the pushing surfaces without being affected by the adjacent elastic bags 210. Preferably, the support plates 220 are tightly packed to fit the shape of the substrate 121. More preferably, total contact area of the support plates 220 and the substrate holding plate 230 is larger than the total contact area of the support plates 220 and the elastic bags 210. A gap between every two adjacent support plates 220 is preferably as small as possible. The large contact area with the support holding plate 230 and the small gap between every two adjacent support plates 220 can reduce an area in the support holding plate 230, which is not pushed by the other members.

The substrate holding plate 230 is a member for holding the substrate 121 at least temporarily. The substrate holding plate 230 in FIG. 2 is a member having a U-shaped section. Portions of the substrate holding plate 230, which correspond to "arms" of the letter U, are secured to the head body portion 200. A surface of the substrate holding plate 230, which is out of contact with the substrate 121, is attached to the support plates 220. The substrate holding plate 230 surrounds the elastic bags 210 and the support plates 220. Preferably, projected area of the substrate holding plate 230 is substantially equal to area of the substrate 121.

The substrate holding plate 230 is desired to have a certain degree of rigidity for holding the substrate 121 and functioning as a reference surface of the polishing of the substrate 121. Preferably, the rigidity of the substrate holding plate 230 is higher than at least that of the elastic bags 210. For example, the substrate holding plate 230 may be made of rigid plastic, such as rigid polyvinyl chloride (PVC).

Openings 231 for vacuum-sucking the substrate 121 are formed near edge portions of the substrate holding plate 230 (in FIG. 2, only one of the openings 231 is provided with the reference mark as a representative). According to the example illustrated in FIG. 2, the head body portion 200 is provided with channels 202 for suction (in FIG. 2, only one of the channels 202 for suction is provided with the reference mark as a representative). The channels 202 for suction are in communication with the openings 231 and connected to the pressure regulating mechanism 140.

The retainer 240 is a member disposed in the head body portion 200 so as to surround side portions of the substrate 121. The retainer 240 ensures that the substrate 121 is placed in a proper position. The retainer 240 may also be used to press the polishing pad 111 to planarize the polishing surface of the polishing pad 111. In FIG. 2, the retainer 240 comprises four elongated cuboidal components arranged along respective edges of the substrate. According to another example, the retainer 240 may be, for example, a quadrangular loop-like member. According to still another example, it is possible to use the retainer 240 whose closest portions to corners of the substrate are formed of independent members. The retainer 240 may be secured to the head body portion 200 through a retainer pressurizing mechanism 241. The retainer pressurizing mechanism 241 illustrated in FIG. 2 is a sac body. The retainer pressurizing mechanism 241 in FIG. 2 is fed with the fluid from the pressure regulating mechanism 140, thus pressing the retainer 240. The configuration of the retainer pressurizing mechanism 241 is not limited to the one illustrated in FIG. 2. The retainer 240 and the other components are so configured, and a fluid feeding amount with respect to the retainer pressurizing mechanism 241 is so controlled that the substrate 121 protrudes from a lowest part of the retainer 240. A protruding amount of the substrate 121 is, for example, equal to or less than a half of thickness of the substrate 121.

The polishing head 120 illustrated in FIG. 2 is capable of more locally controlling the pressing force generated between the polishing pad 111 and the substrate 121 than conventional polishing heads which use a membrane sectioned into a circular or ring-like shape. For example, if the substrate is excessively polished in corners and in middle portions of edges, the polishing of the substrate 121 can be equalized by reducing the internal pressures of the elastic bags 210 located in the corners of the substrate and the middle portions of edges of the substrate and/or by increasing the internal pressures of the elastic bags 210 which are not located in the corners of the substrate and the middle portions of edges of the substrate.

The conventionally-used membranes sectioned by peripheral walls into a plurality of areas are substantially equal in size to the substrate 121. It has therefore taken a large amount of cost and time to manufacture the conventionally-used membranes. Each of components of the polishing head 120 illustrated in FIG. 2 is smaller in size than the substrate 121. It is then considered that the polishing head 120 of FIG. 2 can be produced with more ease, as compared to the conventional polishing heads. Furthermore, the polishing head 120 of FIG. 2 is compatible with substrates 121 of various sizes and shapes by changing the number, arrangement, shape and the like of the elastic bags 210 and the support plate 220.

There are established international standards (Semiconductor Equipment and Materials International standards, also referred to as SEMI standards) for circular substrates, especially circular silicon wafers. Although there might be an exception, circular substrates basically have standardized shapes. As for quadrangular substrates, however, there is not any internationally agreed and diffused standard to the applicant's knowledge at the time of the filing of the present patent application. It is therefore considered that there is a wide variety of quadrangular substrates in terms of size and shape as compared to circular substrates. In this view, to be compatible with substrates in various sizes and shapes is an important function in a polishing apparatus for quadrangular substrates.

The applicant further noticed that the conventionally-used membranes have the following problem. A conventionally-used membrane has portions on or under which the peripheral walls are located, and the rest portions. When the membrane is pressurized, the former portions and the latter portions can be different in expansion amount in the Z direction. Furthermore, the former portions and the latter portions can be different also in rigidity in the Z direction. This causes the problem that the conventionally-used membrane becomes uneven in surface by being pressurized, resulting in a deterioration of polishing uniformity with respect to the substrate 121.

If the substrate 121 has a relatively high rigidity and is, for example, a silicon wafer with a thickness ranging from 0.5 mm to 1 mm, it is considered that the polishing uniformity is not much deteriorated even if the surface of the membrane becomes uneven. However, if the substrate 121 has a relatively low rigidity and is, for example, a resin substrate with a thickness of 0.1 mm, the unevenness generated in the membrane matters. Since the quadrangular substrates are considered to have more variations than the circular substrates as already discussed, the unevenness is likely to deteriorate the polishing uniformity.

The polishing head 120 illustrated in FIG. 2 is not provided with a peripheral wall. According to the polishing head 120 illustrated in FIG. 2, the substrate 121 is not held by an elastic body such as a membrane, but by the substrate holding plate 230. The substrate holding plate 230 is made of material, such as PVC, which has a higher rigidity than the conventional membranes. It is then considered that the substrate holding plate 230 is unlikely to become uneven in surface as compared to the conventional membranes. Consequently, the use of the polishing head 120 illustrated in FIG. 2 can improve the polishing uniformity with respect to the substrate 121.

Figure 3:
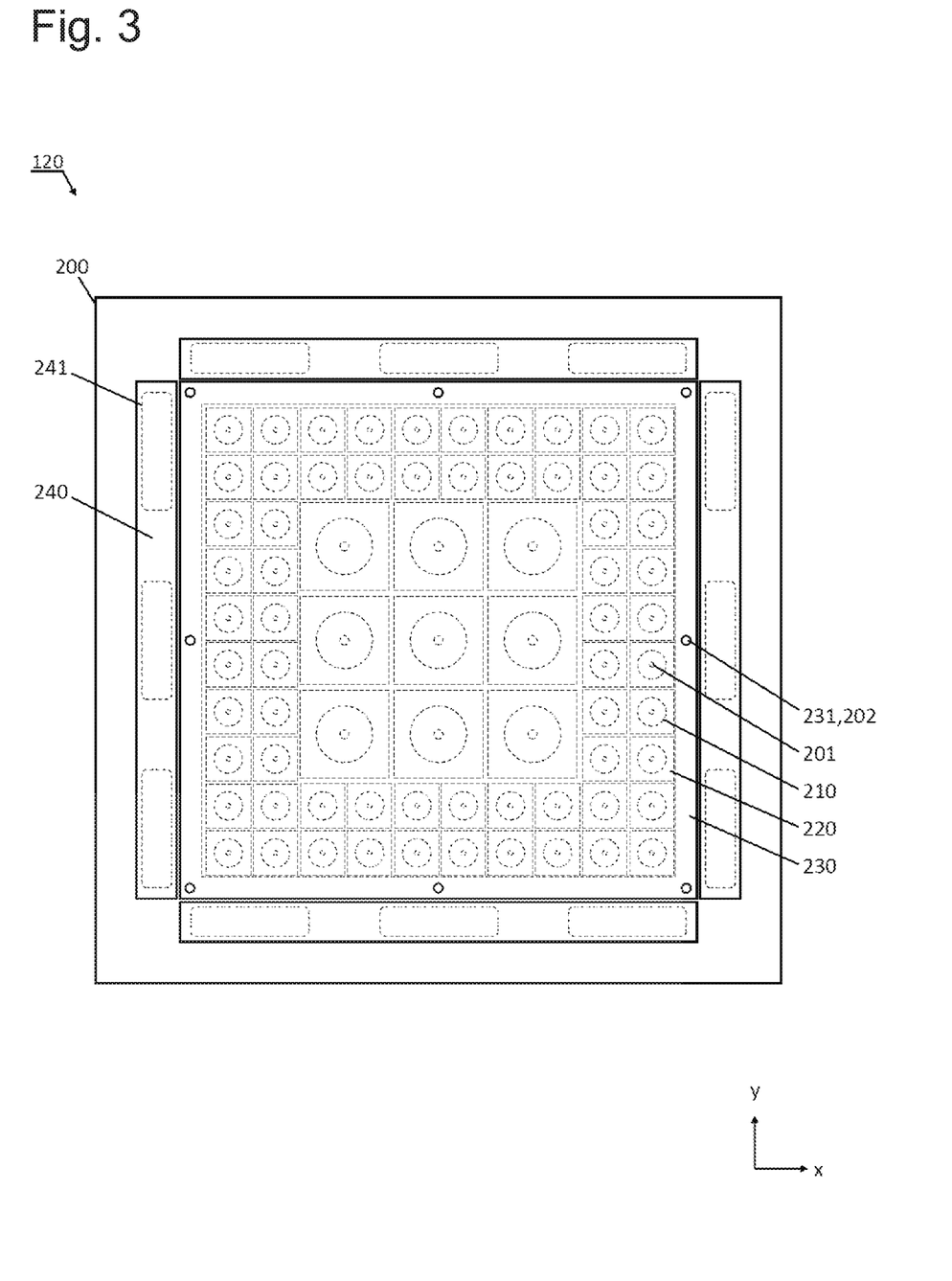
FIG. 3 is a bottom view of a polishing head in which, among elastic bags, the elastic bags for controlling a pressing force applied to an outer peripheral portion of a substrate are smaller in size than the other elastic bags.

A modification example of the polishing head 120 is shown in FIG. 3. FIG. 3 is a bottom view of the polishing head 120 according to the modification example. FIG. 3 shows the elastic bags 210 and the support plates 220 in reduced size, which are located in an outer peripheral portion of the substrate 121 when the substrate 121 is held by the substrate holding plate 230. The "size of the elastic bags 210 and the support plates 220" here means a "size as viewed from the Z direction," that is, "projected area on the X-Y plane." "The elastic bags 210 and the support plates 220, which are located in the outer peripheral portion of the substrate 121 when the substrate 121 is held by the substrate holding plate 230" can be rephrased to read "the elastic bags 210 for controlling the pressing force applied to the outer peripheral portion of the substrate 121 and the support plates 220." The elastic bags 210 and the support plates 220 which are greater in number for the reduced size than the elastic bags 210 and the support plates 220 of the example shown in FIG. 2 are arranged in an area corresponding to the outer peripheral portion of the substrate 121. In FIG. 3, the elastic bags 210 other than the elastic bags 210 for controlling the pressing force applied to the outer peripheral portion of the substrate 121 and the support plates 220 (the elastic bags 210 and the support plates 220, which are located near a center) are larger in size than the elastic bags 210 for controlling the pressing force applied to the outer peripheral portion of the substrate 121 and the support plates 220.

As discussed above, when the quadrangular substrate 121 is polished while being pressed against the polishing pad, the corners of the substrate and the middle portions of edges of the substrate are prone to be polished with a large polishing amount, depending on how the substrate polishing apparatus 100 is configured. It is therefore preferable that the pressing force applied to the outer peripheral portion of the quadrangular substrate 121 can be precisely controlled. On the other hand, it is considered that, in the area near the center of the quadrangular substrate 121, the pressing force does not have to be as precisely controlled as in the area near the outer peripheral portion. According to the configuration illustrated in FIG. 3, the pressing force can be more precisely and more locally controlled in the outer peripheral portion of the substrate 121 by a large number of elastic bags 210 and support plates 220 in the reduced size. Since the elastic bags 210 and the support plates 220, which are located near the center, remain large in size, it is possible to reduce the number of components and facilitate the control, as compared to if all the elastic bags 210 and the support plates 220 are downsized and tightly packed.

FIG. 3 shows the example in which both the elastic bags 210 and the support plates 220 are downsized. It is also possible to downsize either the elastic bags 210 or the support plates 220. For example, if only the elastic bags 210 are downsized, a plurality of elastic bags 210 share a single support plate 220. FIG. 3 shows the example in which the elastic bags 210 for controlling the pressing force applied to the outer peripheral portion of the substrate 121 and the support plates 220 are downsized. Alternatively, the elastic bags 210 for controlling the pressing force applied to the corners of the substrate 121 and/or the support plates 220 may be downsized.

Figure 4:
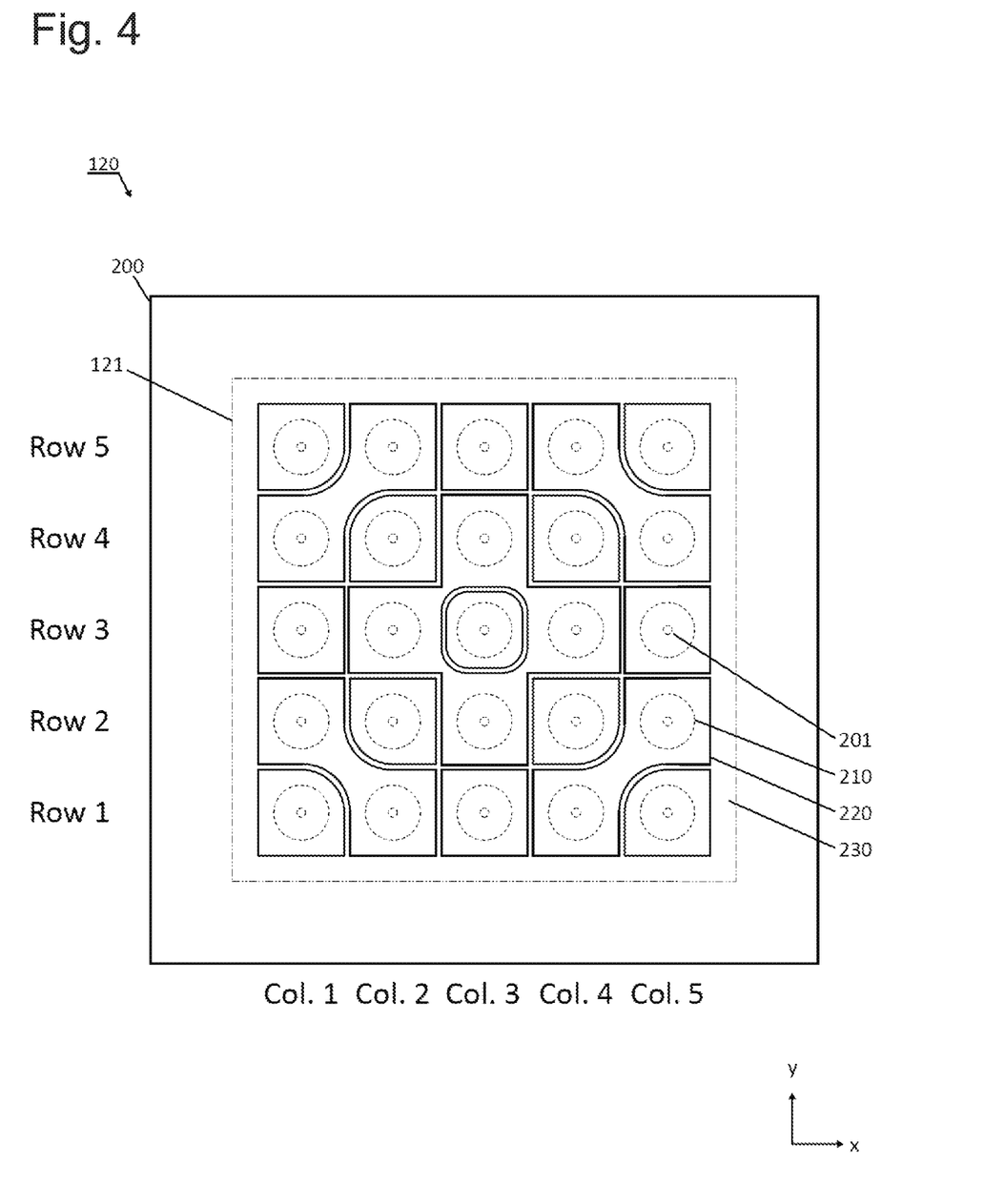
FIG. 4 is a bottom view of a polishing head with support plates arranged into a symmetrical shape as a whole.

FIG. 4 shows another modification example of the polishing head 120. For the sake of convenience of illustration, FIG. 4 does not show the channels 202 for suction, the substrate holding plate 230, the openings 231, the retainer 240, and the retainer pressurizing mechanism 241. FIG. 4 shows the substrate 121 as an alternative with imaginary lines.

If the substrate 121 is symmetric, and there is not any external factor which disrupts the symmetry, a polishing profile of the substrate 121 is also considered to be symmetry. The example illustrated in FIG. 4 uses support plates 220 having a different shape from the support plates 220 of FIG. 2, materializing reduction of the number of components, improvement of polishing uniformity, and facilitation of control. The support plates 220 of FIG. 4 are arranged in a symmetric form as a whole. For the sake of convenience of explanation, FIG. 4 shows row and column numbers of the elastic bags 210. Hereinafter, the locations of the elastic bags 210 will be indicated as (column number, row number). In the figure, each of the column numbers is indicated as "Col. x," and the row number as "Row y" (x and y are integral numbers started with 1 (one)).

The support plates 220 provided for the elastic bags 210 located in the following positions are similar to the support plates 220 of FIG. 2: (1, 1), (1, 3), (1, 5), (2, 2), (2, 4), (3, 1), (3, 3), (3, 5), (4, 2), (4, 4), (5, 1), (5, 3) and (5, 5).

One of the support plates 220 has a cross shape with a center hollowed, and is provided for the elastic bags 210 located in (2, 3), (3, 2), (3, 4) and (4, 3). In other words, the elastic bags 210 located in (2, 3), (3, 2), (3, 4) and (4, 3) share the single cross-shaped support plate 220. Likewise, one of the support plates 220 has a dumbbell shape (more specifically, a dumbbell shape in a planar view) and is provided for the elastic bags 210 located in (1, 2) and (2, 1). There are some more dumbbell-shaped support plates 220 provided for the elastic bags 210 located in (1, 4) and (2, 5), (4, 1) and (5, 2), and (4, 5) and (5, 4).

Since the plurality of elastic bags 210 symmetrically arranged with (3, 3) located at the center share the single support plate 220, the support plates 220 can be reduced in number. Furthermore, since the plurality of elastic bags 210 symmetrically arranged share the single support plate 220, the pressing forces generated from the plurality of elastic bags 210 symmetrically arranged are equalized. The configuration illustrated in FIG. 4 is therefore considered to improve the polishing uniformity with respect to the substrate 121.

The polishing head 120 may be configured so that the internal pressures of the plurality of elastic bags 210 symmetrically arranged with (3, 3) located at the center are substantially equal to one another. For example, the polishing head 120 may be configured so that the channels 201 for bags connected to the elastic bags 210 located at (2, 3), (3, 2), (3, 4) and (4, 3) are joined together so that the aforementioned elastic bags 210 are constantly applied with equal pressures. For another example, the channels 201 for bags, which are connected to the elastic bags 210 located at (1, 1), (1, 5), (5, 1) and (5, 5), may be joined together. If the polishing head 120 is configured so that the internal pressures of the elastic bags 210 symmetrically arranged are substantially equal to one another, the internal pressures of all the elastic bags 210 do not have to be individually controlled. In short, the configuration illustrated in FIG. 4 facilitates the control over the internal pressures of the elastic bags 210. Furthermore, if the channels 201 for bags, which are provided for the elastic bags 210 symmetrically arranged, are joined together, the internal pressures of the elastic bags 210 symmetrically arranged can be equalized. If the support plates 220 are disposed under the respective elastic bags 210 (see FIG. 2), the pressing forces can be more locally controlled than in the example illustrated in FIG. 4.

The configuration of the support plates 220 in FIG. 4 is only an example. It should be noted that the configuration of the support plates 220 should be determined as appropriate according to the shape of the substrate 121, the shape and number of the elastic bags 210, etc. Particularly, the configuration of the support plates 220 is preferably determined according to a symmetric property of the substrate 121. The polishing head 120 includes at least two independent support plates 220.

Figure 5:
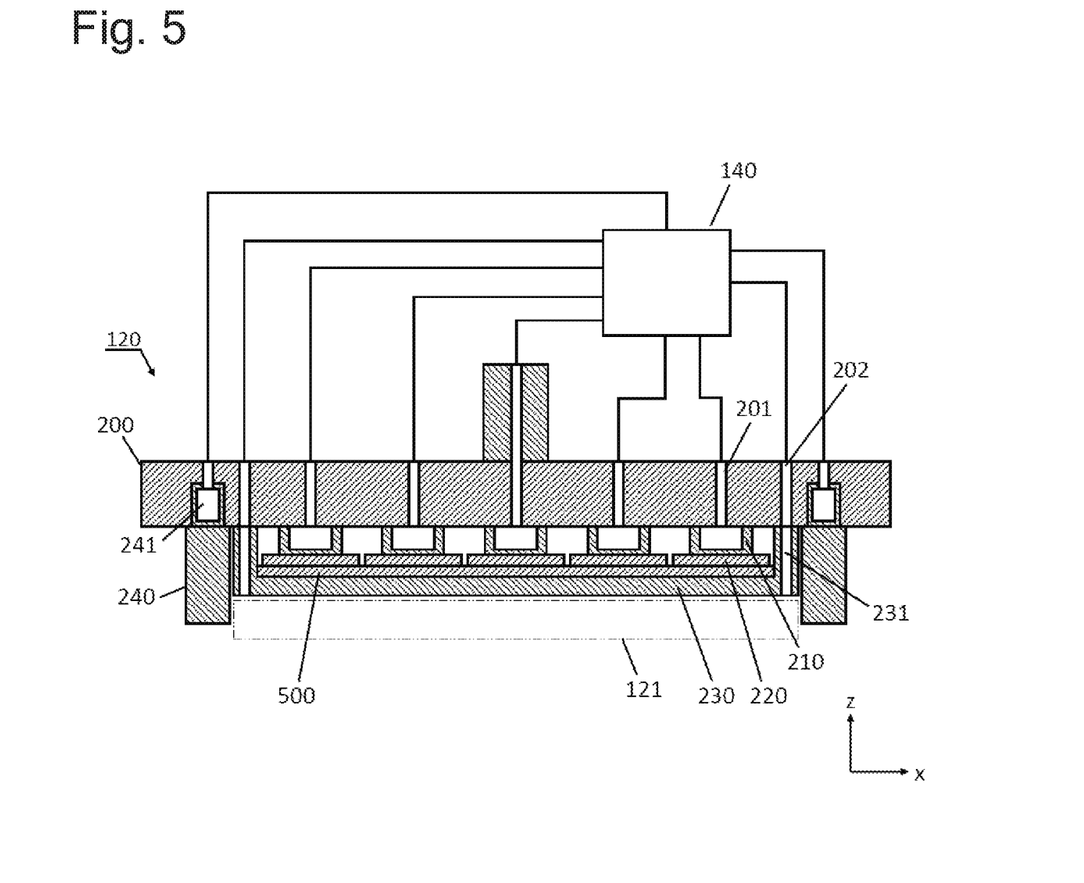
FIG. 5 is an elevation sectional view of a polishing head with a flexible intermediate plate.

As still another example, a polishing head 120 including a flexible intermediate plate 500 will be now discussed. FIG. 5 is an elevation sectional view of the polishing head 120 with the flexible intermediate plate 500. The flexible intermediate plate 500 is a flexible plate-like member which is disposed between the support plates 220 on one hand and the substrate holding plate 230 on the other. The term "flexible" here means that the intermediate plate 500 has a lower rigidity than the support plates 220 and the substrate holding plate 230. The rigidity of the flexible intermediate plate 500 may be either higher or lower than that of the elastic bags 210. For example, the flexible intermediate plate 500 may be made of material such as sponge and rubber.

The substrate holding plate 230 has a certain degree of rigidity as mentioned. The support plates 220 are higher in rigidity than the substrate holding plate 230 in some cases. If highly-rigid members are used in combination, and either one of the members has an uneven surface, these members contact each other only at some areas. Accordingly, when the highly-rigid members are brought into contact with each other, there is a possibility that force transmission from one of the members to the other is uneven.

The polishing head 120 of FIG. 5 includes the flexible intermediate plate 500 disposed between the support plates 220 on one hand and the substrate holding plate 230 on the other. In other words, the substrate holding plate 230 is indirectly fitted to the support plates 220 with the flexible intermediate plate 500 intervening therebetween. Being flexible, the flexible intermediate plate 500 can be deformed according to an uneven surface of each of the support plates 220 and/or the substrate holding plate 230. As compared to contact between the highly-rigid members, contact between the flexible intermediate plate 500 on one hand and the support plates 220 on the other and contact between the flexible intermediate plate 500 and the substrate holding plate 230 are similar to a surface contact. Since the polishing head 120 is provided with the flexible intermediate plate 500, the pressing forces can be equally transmitted from the support plates 220 to the substrate holding plate 230.

According to the example illustrated in FIG. 5, the polishing head 120 includes the single flexible intermediate plate 500. In other words, according to the example of FIG. 5, all the support plates 220 share the single flexible intermediate plate 500. However, the flexible intermediate plate 500 is not limited in number. For example, flexible intermediate plates 500 may be disposed in respective spaces between the respective support plates 220 and the substrate holding plate 230. In this case, the number of the flexible intermediate plates 500 is the same as that of the support plates 220.

Several embodiments of the invention have been discussed. These embodiments are not intended to limit the invention but to facilitate the understanding of the invention. The invention may be modified or improved without deviating from the gist thereof, and includes equivalents thereto. The elements mentioned in the claims and the description may be arbitrarily combined or omitted as long as at least a part of the above-mentioned problem is solved or at least a part of the advantageous effects is produced.

For example, the number and shape of the elastic bags 210 are not limited to those illustrated in the figures. Although the substrate 121 has a square shape (or more specifically, a quadrangular pillar having a square bottom surface) according to the embodiments, the substrate 121 may have a quadrangular shape other than a square, such as a rectangular shape and a trapezoidal shape. The substrate 121 does not have to have a quadrangular shape and may have a triangular shape, a pentagonal shape or another like shape. It is also possible, for example, to combine the configuration illustrated in FIG. 3 and the configuration illustrated in FIG. 4.

According to the embodiments and the modification examples, the polishing head of the invention is applied to the CMP apparatus of a facedown type. Instead of the facedown type, the polishing head of the invention can be also applied to a CMP apparatus of a face-up type (namely, an apparatus of a type which performs the polishing with a to-be-polished surface of a substrate facing upward). The terms "up" and "down" in the present patent application merely indicate relative directions. It is possible to downsize the polishing apparatus as seen in the Japanese Unexamined Patent Application Publication (Kokai) No. 10-291151, for example, by installing a polishing table with a polishing pad above a quadrangular substrate which is held on an upper surface of a polishing head. The polishing pad is a few centimeter longer than total length of double lengths of the longest distance between a center of a quadrangular substrate and a corner (a diagonal line if the substrate is rectangular) and double widths of a retainer. The facedown substrate polishing apparatus 100 of FIG. 1 may be used upside down. In the case of the face-up polishing apparatus, a substrate processing solution, such as a polishing solution, a chemical solution and/or a cleaning solution, is preferably fed from the opening of the polishing pad through the polishing table onto an upper surface of the substrate located under the opening.

The present patent application discloses, as one embodiment, a polishing head of a polishing apparatus for polishing a quadrangular substrate using a polishing pad attached to a polishing table, the polishing head comprising a head body portion, a plurality of elastic bags disposed in a surface of the head body portion, which is to face the polishing table, and a substrate holding plate for holding the substrate, the substrate holding plate being pressed by the elastic bags in a direction away from the head body portion, the head body portion being provided with channels for bags, which are in communication with the respective elastic bags, the polishing head further including at least two support plates disposed between the elastic bags on one hand and the substrate holding plate on the other, the elastic bags being configured to press the substrate holding plate through the support plates.

The polishing head provides, as one example, an advantageous effect of making it possible to locally control a pressing force generated between the substrate and the polishing pad by controlling internal pressures of the elastic bags.

The present patent application further discloses, as one embodiment, the polishing head in which the support plates are higher in rigidity than the elastic bags, and in which the substrate holding plate is higher in rigidity than the elastic bags.

The polishing head provides, as one example, an advantageous effect of allowing the elastic bags to uniformly push the substrate holding plate. The polishing head further provides, as one example, an advantageous effect of uniformly polishing the substrate, as compared to an apparatus using a conventional membrane.

The present patent application discloses, as one embodiment, the polishing head in which the elastic bags are arranged in rows and columns according to a shape of the substrate.

The polishing head provides, as one example, an advantageous effect of facilitating control over a local pressing force generated between the substrate and the polishing pad.

The present patent application discloses, as one embodiment, the polishing head in which total contact area of the support plates and the support holding plate is larger than total contact area of the support plates and the elastic bags.

The polishing head provides, as one example, an advantageous effect of reducing an area of the support holding plate, which is not pushed by other members.

The present patent application discloses, as one embodiment, the polishing head in which, among the elastic bags, the elastic bags for controlling the pressing force applied to an outer peripheral portion of the substrate are smaller in size than the other elastic bags.

The polishing head provides, as one example, an advantageous effect of making it possible to more precisely and more locally control a pressing force in the outer peripheral portion of the substrate.

The present patent application further discloses, as one embodiment, the polishing head in which, among the channels for bags, the channels for bags, which are in communication with a first elastic bag and a second elastic bag, are joined together, the first elastic bag being intended to press an area of the substrate, the second elastic bag being intended to press an area of the substrate, which is located in a symmetrical position to the area pressed by the first elastic bag.

The polishing head provides, as one example, an advantageous effect of facilitating control over internal pressures of the elastic bags.

The present patent application further discloses, as one embodiment, the polishing head in which the support plates are disposed between the respective elastic bags on one hand and the substrate holding plate on the other.

The polishing head provides, as one example, an advantageous effect of locally controlling the pressing force, as compared to when two or more elastic bags share a single support plate.

The present patent application discloses, as one embodiment, the polishing head in which a third elastic bag for pressing an area of the substrate and a fourth elastic bag for pressing an area of the substrate, which is located in a symmetrical position to the area pressed by the third elastic bag, share the same support plate.

The polishing head provides, as one example, an advantageous effect of equalizing pressing forces from the elastic bags symmetrically arranged and/or facilitating control over internal pressures of the elastic bags.

The present patent application discloses, as one embodiment, the polishing head further comprising a flexible intermediate plate disposed between the substrate holding plate on one hand and the support plates on the other.

The polishing head provides, as one example, an advantageous effect of equalizing transmission of the pressing forces from the support plates to the substrate holding plate.

The present patent application discloses, as one embodiment, a polishing apparatus comprising a polishing table for attaching a polishing pad in a detachable manner, the polishing table being attached with the polishing pad, and the polishing head according to any one of embodiments disclosed in the specification, the polishing head facing the polishing table. The present patent application further discloses, as one embodiment, the polishing apparatus further comprising a pressure regulating mechanism connected to the channels for bags.

Details of the apparatus applied with the polishing head of the embodiments are evident from the foregoing disclosure.

REFERENCE SIGN LIST

100: substrate polishing apparatus
110: polishing table
111: polishing pad
120: polishing head
121: substrate
130: liquid discharging mechanism
140: pressure regulating mechanism
150: controller
200: head body portion
201: channel for a bag
202: channel for suction
210: elastic bag
220: support plate
230: substrate holding plate
231: opening
240: retainer
241: retainer pressurizing mechanism
500: flexible intermediate plate

What is claimed is:
1. A polishing head of a polishing apparatus for polishing a quadrangular substrate using a polishing pad attached to a polishing table, comprising:
   a head body portion;
   a plurality of elastic bags disposed in a surface of the head body portion, which is to face the polishing table; and a substrate holding plate for holding the substrate, the substrate holding plate being pressed by the elastic bags in a direction away from the head body portion, the head body portion being provided with channels for bags, which are in communication with the respective elastic bags, the polishing head further including at least two support plates disposed between the elastic bags and the substrate holding plate, and a flexible intermediate plate disposed between the substrate holding plate and the support plates, the elastic bags being configured to press the substrate holding plate through the support plates, wherein the at least two support plates are arranged from a center region to an edge portion of the substrate holding plate.

2. The polishing head according to claim 1, wherein the support plates are higher in rigidity than the elastic bags, and the substrate holding plate is higher in rigidity than the elastic bags.

3. The polishing head according to claim 1, wherein:
the elastic bags are arranged in rows and columns according to a shape of the substrate.

4. The polishing head according to claim 1, wherein total contact area of the support plates and the support holding plate is larger than total contact area of the support plates and the elastic bags.

5. The polishing head according to claim 1, wherein among the elastic bags, the elastic bags for controlling a pressing force applied to an outer peripheral portion of the substrate are smaller in size than the other elastic bags.

6. The polishing head according to claim 1, wherein among the channels for bags, the channels for bags, which are in communication with a first elastic bag and a second elastic bag of the plurality of elastic bags, are joined together, the first elastic bag being intended to press an area of the substrate, the second elastic bag being intended to press an area of the substrate, which is located in a symmetrical position to the area pressed by the first elastic bag.

7. The polishing head according to claim 1, wherein the support plates are disposed between the respective elastic bags and the substrate holding plate.

8. The polishing head according to claim 6, wherein a third elastic bag of the plurality of elastic bags for pressing an area of the substrate and a fourth elastic bag of the plurality of elastic bags for pressing an area of the substrate, which is located in a symmetrical position to the area pressed by the third elastic bag, wherein the third and fourth elastic bags share the same support plate.

9. A polishing apparatus comprising:
a polishing table for attaching a polishing pad in a detachable manner, the polishing table being attached with the polishing pad, and the polishing head according to claim 1, the polishing head facing the polishing table.

10. The polishing apparatus according to claim 9, further comprising a pressure regulating mechanism connected to the channels for bags.

11. A polishing head of a polishing apparatus for polishing a quadrangular substrate using a polishing pad attached to a polishing table, comprising:
a head body portion;
a plurality of elastic bags disposed in a surface of the head body portion, which is to face the polishing table; and
a substrate holding plate for holding the substrate, the substrate holding plate being pressed by the elastic bags in a direction away from the head body portion, the head body portion being provided with channels for bags, which are in communication with the respective elastic bags, the polishing head further including at least two support plates disposed between the elastic bags and the substrate holding plate, the elastic bags being configured to press the substrate holding plate through the support plates, the polishing head further comprising a flexible intermediate plate disposed between the substrate holding plate and the support plates.

* * * * *